United States Patent [19]

Adler

[11] Patent Number: 4,997,516

[45] Date of Patent: Mar. 5, 1991

[54] METHOD FOR IMPROVING ADHERENCE OF COPPER FOIL TO RESINOUS SUBSTRATES

[76] Inventor: Edward Adler, 266 Arch Rd., Englewood, N.J. 07681

[21] Appl. No.: 442,618

[22] Filed: Nov. 29, 1989

Related U.S. Application Data

[62] Division of Ser. No. 377,532, Jul. 10, 1989.

[51] Int. Cl.$^5$ .......................... C23F 1/00; B44C 1/22; C03C 15/00; C03C 25/06
[52] U.S. Cl. .................... 156/630; 156/634; 156/645; 156/656; 156/659.1; 156/666; 156/902; 752/79.2; 752/79.5; 427/309
[58] Field of Search .............. 156/630, 634, 645, 656, 156/659.1, 666, 902; 427/309, 96; 134/3, 41; 252/79.2, 79.4, 79.5; 29/846; 428/621

[56] References Cited

U.S. PATENT DOCUMENTS

| | | | |
|---|---|---|---|
| 3,198,672 | 8/1965 | De Hart | 148/6.14 |
| 3,936,548 | 2/1976 | Konicek | 427/405 |
| 3,990,926 | 11/1976 | Konicek | 156/151 X |
| 4,394,419 | 7/1983 | Konicek | 428/416 |
| 4,503,112 | 3/1985 | Konicek | 428/216 |
| 4,549,940 | 10/1985 | Karwan | 204/13 |
| 4,642,161 | 2/1987 | Akahoshi et al. | 156/630 |
| 4,715,116 | 12/1987 | Thorpe et al. | 29/846 |
| 4,774,122 | 9/1988 | Adler | 428/156 |
| 4,781,991 | 11/1988 | Thorpe et al. | 428/626 |

FOREIGN PATENT DOCUMENTS 153797 11/1981 Japan.

OTHER PUBLICATIONS

New Copper Surface Treatment for Polyimide Multilayer Printed Wiring Boards by Haruo Akahoshi et al., Printed Circuit World Convention IV (1987).
New Copper Surface Treatment for Polyimide Multilayer PWBs by Haruo Akahoshi et al., PC FAB, Jan. 1990.
Innerlayer Treatment with Electroless Copper Plating by A. Nakaso et al., PC FAB, Nov. 1989, pp. 101–106.

*Primary Examiner*—William A. Powell
*Attorney, Agent, or Firm*—Darby & Darby

[57] ABSTRACT

The present invention comprises an improvement in the surface treatment of copper surfaces. It produces a strong and stable bond, resistant to chemical attack and to thermal and mechanical stresses between said copper foil surfaces and adjacent surfaces of resinous layers. It is especially useful in multilayer printed circuit fabrication and in the treatment of copper circuit lines and areas which are disconnected from each other, that is, which do not have electrically conductive continuity. In a method according to the invention, an oxidized cooper surface is reduced in the presence of a polymer addition agent, and the partially reduced surface is then exposed to a nonoxidizing reagent. The result is a reticulated metallic copper microstructure capable of forming a strong adhesive bond with a resinous substrate, and having a high resistance to thermal, mechanical, and chemical (e.g. acid) stress.

16 Claims, No Drawings

METHOD FOR IMPROVING ADHERENCE OF COPPER FOIL TO RESINOUS SUBSTRATES

This is a division of application Ser. No. 377,532, filed July 10, 1989.

BACKGROUND OF THE INVENTION

Copper foil is used in the making of printed circuits. Electro-deposited copper foil, the kind of foil most commonly used, is made by depositing copper on a cylinder rotating in a copper plating bath and then stripping the layer of deposited copper foil from the cylinder. The surface of the foil adjacent to and in contact with the cylinder is a replica of the cylinder surface. Since the cylinder surface is usually polished, that copper foil surface is "shiny" and is so designated, distinguishing it from the other side, the matte side, of the copper foil. The matte side is generally crystalline with micro peaks of several microns or greater in height. The surface character of the matte side is determined by the conditions of electro-deposition - bath composition, current density, temperature, thickness of deposit, addition agents and the like.

Electro-deposited copper foil is described, for example, in Sarazin et al., U.S. Pat. No. 3,984,598 (1976); Luce et al., U.S. Pat. No. 3,585,010 (1971); and in Rider et al., "Printed and Integrated Circuitry," (New York: McGraw-Hill 1963), pp. 24–27.

Sarazin describes known deposition methods, including one where a thin metal-clad laminate is prepared by depositing a copper coating on a substrate treated with a release agent, treating the exposed copper surface to improve adhesion, bonding the treated surface to a resinous laminate using a bonding agent, and removing the substrate, which is weakly bonded to the copper because of the release agent. The copper surface is treated by subjecting the copper to a high current density, to cause roughening, and oxidizing the surface by adding heat, to prime the surface for the bonding agent, such as a silane compound. Luce describes conventional electro-deposition methods which incorporate a protective barrier layer between the copper layer and the resinous laminate. Rider provides an overview of known copper deposition procedures.

When the copper foil is bonded or laminated to a resinous substrate such as epoxy, polyimide, phenolic and the like, which may be reinforced with glass or other fibers, good adhesion between the copper layer and the resinous substrate is important to prevent separation in subsequent procedures such as soldering, or from thermal or mechanical stress. Accordingly, the matte side of the copper foil, rather than the shiny side, is used for lamination since the surface roughness of the matte provides better adhesion. But, the matte side along usually does not have sufficient "roughness" for good adhesion and accordingly, the matte surface is treated to improve its adhesive strength.

The most commonly used treatment in commercial use today involves electrolytic deposition upon the matte side of a layer of copper microdendrites which may be further processed by known methods. This treatment, called "Treatment A" was invented by the present inventor in 1957 (but was not patented), and employs a high-current density short of burning, to deposit adherent microdendrites on the surface of the previously deposited copper foil. One such method, which builds on the original Treatment A, is disclosed in Luce,'010, supra, and Luce, U.S. Pat. No. 3,293,109. See also, Conley, U.S. Pat. No. 3,220,897.

A typical peel strength of a treated matte copper surface (copper thickness 35 microns) bonded to a glass-reinforced epoxy base, may be from 10–14 lbs/in. of width, whereas the peel strength of an untreated matte surface may be from 1–3 lbs/in. The peel strength of an untreated shiny side will be less than 1 lb/in. When applied to the shiny side of copper foil, an electrochemical treatment such as Treatment A may provide a peel strength of 7–9 lb/in. when bonded to an epoxy substrate. Although treatment of the shiny side alone by electrochemical means is not ordinarily done, sometimes both sides of the copper foil are treated. However, this two-sided treatment presents difficulties in processing and handling.

In subsequent steps for making printed circuits, the untreated shiny side of the copper clad laminate is coated with a resist in selected areas by photomechanical or other procedures and the uncoated copper areas etched away down to the substrate of the laminate. When the resist is then removed, a printed circuit or "printed wiring" is produced. When appropriate components such as resistors, transistors and the like are attached to the copper clad laminate, for example by soldering, the result is a printed circuit board.

For reasons of economy and also of miniaturization, two-sided printed circuit boards are frequently used. The circuits on the two sides are interconnected by holes which are drilled and then metallized by techniques known to the art. In two-sided boards, both sides of the board have treated matte surfaces of copper foil bonded to the resinous substrate.

A subsequent stage in the evolution of modern printed circuit board technology was the development of multi-layer boards which may comprise from four to as many as twenty or more circuit sides. Such multi-layer structures require that the shiny side of the copper foil after etching to make circuits, be bonded to resinous surfaces in the interior circuit layers. The resinous surfaces may comprise those of prepreg layers, that is, B-stage glass-reinforced resinous layers which under heat and pressure act to bond together adjoining copper circuit sides. Since adhesion to the adjacent resinous substrate of the shiny side surfaces of the copper circuit lines would be very poor otherwise, these shiny side copper circuit lines must be treated to provide adequate bond strength so as to prevent delamination from thermal and other stresses.

The copper circuit lines on these boards are usually disconnected elements, that is, not in electrical continuity one to another. Therefore, further electrolytic processing to improve adhesion, such as that used in the Treatment A process above mentioned, is not feasible. Chemical processes must be used instead. The most frequently used procedure in commercial practice at the present time, called "black oxide" or "brown oxide" processing comprises oxidation of the shiny side copper surface in alkaline solutions at elevated temperatures by oxidizing agents such as sodium chloride. As a result of such black or brown oxide processing, peaks or whiskers of copper oxides (cupric/cuprous) are produced. The increase in surface area and also the locking-in effect of the whisker microtopography of the surface to the resinous substrate results in improved adhesion, with peel strength values of from 5–7 lbs/in. or so. Black oxide processing is described for decorative purposes, for example, in two patents to Meyer, U.S. Pat.

Nos. 2,364,993 and 2,460,896, and one patent to MacMahon, U.S. Pat. No. 2,481,854. Black oxide treatments for bonding copper foil to laminates for printed circuit purposes are described in Rider, *supra.*, p. 27.

Copper oxides such as cupric/cuprous oxides are soluble in acid, and serious difficulties may arise as a result of later process steps which involve the use of acid. For example, while drilling holes for through connections, epoxy resin is smeared on the surface of the holes. To remove the smear and also to remove glass fiber fragments, acids such as sulfuric acid and hydrofluoric acid are frequently used. These acids can attack the copper oxide whiskers at the interface or junction between the copper surface and the adjacent resinous layer, resulting in the so-called "pink ring" phenomenon. Pink ring consists of a copper surface from which the black or brown copper oxide has been dissolved away. Such pink rings may extend several millimeters or more inward from the hole circumference. The bond between the circuit area and the resinous layer is substantially destroyed and this may lead to serious delamination problems. The present invention is especially useful in obtaining good through-hole connections with improved bonding, superior mechanical and electrical properties, and without "pink ring."

SUMMARY OF THE INVENTION

The present invention comprises an improvement in the surface treatment of copper surfaces. It produces a strong and stable bond, resistant to chemical attack and to thermal and mechanical stresses between said copper foil surfaces and adjacent surfaces of resinous layers. It is especially useful in multilayer printed circuit fabrication and in the treatment of copper circuit lines and areas which are disconnected from each other, that is, which do not have electrically conductive continuity.

The present invention starts with an oxidized copper surface which has been treated by "black oxide" procedures known to the art to produce an array of black or brown copper oxide whiskers or peaks. At least a portion of these peaks are then reduced to copper peaks or whiskers. The reduction step is carried out in alkaline solution with sodium hydrosulfite or similar reductant in the presence of a polymer addition agent such as glue, gelatin, gum arabic, dextrin, polyacrylate or the like.

In the reduction procedure, a portion of the original black copper oxide peaks or whiskers is simultaneously reduced to a hydrous cuprous oxide or cuprous hydroxide. This portion is dissolved in a nonoxidizing acid which does not substantially attack or dissolve that portion reduced to metallic copper. Such a reagent, for example, is dilute hydrochloric acid containing additional chloride ion.

The invention can best be understood by the following description and examples which are illustrative and do not limit the appended claims.

DETAILED DESCRIPTION

Many reducing agents are available which can reduce cupric compounds in aqueous solution to metallic copper. These include formaldehyde, sodium hypophosphite, hydrazine and the like. Such reducing agents are commonly used in electroless procedures known to the art for metallizing plastic surfaces. When these reagents were tested on black or brown copper oxide treated surfaces, some did not react at all and others were found to reduce the copper oxide whiskers to copper in powdery form. That is, the discrete cupric oxide whisker structure was broken up and the microtopography of peaks or whiskers required to form a good and stable bond to resinous substrates was destroyed.

Thus, an object achieved by the present invention is to convert the microstructure of the black or brown copper oxide treatment with peaks to a microstructure comprised substantially of metallic copper peaks or whiskers and with substantially little or no powder. Copper powder must be substantially absent from the final surface in order to prevent shorting between adjacent copper circuits in the printed circuit.

It was found unexpectedly that sodium hydrosulfite (a reducing agent) in the presence of high molecular weight addition agents (such as glue, gelatin, gum arabica, dextrin, polyacrylate or the like) produces a stable copper microstructure comprised substantially of metallic copper peaks or whiskers. Of the original black copper oxide content, approximately 50–80% is reduced by sodium hydrosulfite in the presence of an appropriate polymer, to hydrous cuprous oxide; the balance, 20–50% of the original copper oxide content, is simultaneously reduced to metallic copper peaks or whiskers. After the hydrous green cuprous oxide is removed by dissolving away, and the surface rinsed and dried, the resulting copper whisker surface exhibits a strong bond to resinous substrates when laminated. These laminates are not susceptible to pink ring formation and exhibit excellent resistance to chemical attack at the edges of drilled holes and sheared edges and are extremely stable under thermal and mechanical stresses.

The peel strength of such reduced copper-epoxy laminates is slightly lower than that of black oxide-epoxy laminates. Experiments have shown that the peel strength achieved by the invention ranges generally from about 5 to about 7 lbs/in., compared to the typical range for conventional black oxide processes of from about 5 to 8 lbs/in. This small reduction in peel strength is more than offset by an increased stability and resistance to chemical attack and to thermal and mechanical stresses.

For example, a standard test for pink ring measures the susceptibility of a copper foil laminate surface to acid attack, by immersing a test specimen in 10% HCl at 30° C., for up to several hours. The specimen is prepared by etching a line of copper foil, typically one cm wide, bonded to a transparent laminate by a conventional black oxide method. After twenty minutes, the specimen shows deterioration and dissolution of the black oxide by as much as 3–5 mm inward from each edge, resulting a in pink region comparable to the pink ring phenomenon observed in printed circuit boards of this type. As is well known in the art, peel strength decreases significantly in proportion to the fraction of the area destroyed or delaminated by acid attack, e.g., pink ring.

A similar test specimen was prepared according to the invention, by bonding the transparent laminate to a reduced copper surface. After two hours immersion in 10% HCl at 30° C., there was no attack at the interface between the copper foil and the laminate. In fact, the pink ring phenomenon was entirely absent, nor was there any reduction in peel strength.

The reduction of copper oxide to copper is apparently a simple chemical reaction. What is not simple is how to carry out the reduction in such a way that the copper product constitutes a microstructure (with peaks, not powder) capable of producing a good bond when applied to a resinous substrate.

The equation for the reduction of cupric oxide is

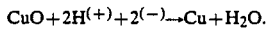
$$CuO + 2H^{(+)} + 2^{(-)} \rightarrow Cu + H_2O.$$

Because of the stoichiometric loss of mass (20%) and the greater density of copper (Cu; d=8.9) compared to the density of the oxide (CuO; d=6.4), the reduced copper product has a volume of less than 60% of that of the original copper oxide. Furthermore, perhaps because of the reduction in volume, the reduction of cupric oxide whiskers is frequently accompanied by breakage of the whiskers.

Thus, the reduction of black copper oxide whiskers by strong reducing agents such as formaldehyde, produces a mass of copper particles or powder rather than a microstructure of discrete copper whiskers. It is to be expected that the degree of adhesion of a treated copper surface is a function, among other things, of the number of peaks or whiskers per unit area and of the specific size and shape of the individual whisker. Thus, a "knobby" whisker would make for better adhesion than a "smooth" whisker.

It is most desirable to convert an array of black cupric oxide whiskers to an array of copper whiskers of sufficient number and microshape to produce good adhesion when the so-treated copper foil is laminated to a resinous substrate.

The following examples demonstrate that this is not easily achieved.

1. Formaldehyde

Formaldehyde reduces black cupric oxide more readily at higher pH values and at elevated temperatures. At 190° F. and in a solution containing 20 g/l. NaOH and 5 g/l. formaldehyde, the reaction begins rapidly and gassing (release of hydrogen) rapidly develops. In about 1–2 minutes the gassing stops and the surface color changes from black to reddish brown. The product is copper and the surface texture is very powdery. If the surface is wiped with a soft paper tissue, the powder is easily removed and transferred to the tissue. Similarly if "Scotch tape" is applied to the treated surface and removed, much powder is transferred to the surface of the Scotch tape leaving a smooth coppery surface behind.

The original black oxide surface had a peel strength of 6.0 to 6.5 lb/inch, while the peel strength of the formaldehyde-reduced surface is 3 to 4.5 lb/inch, in each case measured after laminating to an epoxy prepreg layer pressed at 350° F.

The powdery surface is objectionable for several reasons. The copper powder: (a) significantly reduces peel strength, apparently through loss of the desired reticulated microstructure; (b) is conductive and may cause "shorting" between conductor lines in the printed circuit made with that copper foil treatment; (c) will be encapsulated in the resinous substrate during lamination; and (d) is difficult or impossible to selectively remove.

2. Sodium Hypophosphite

In spite of the fact that sodium hypophosphite is a powerful reducing agent finding extensive use in electroless deposition of copper and nickel from solutions of these ions, this reductant does not substantially react with black cupric oxide treated surfaces. The surface was substantially unchanged under conditions of sodium hypophosphite concentrations of 30 g/l. at pH values from 6 to over 13 and temperatures up to 200° F. When the black cupric oxide is pretreated by dipping into a dilute solution of palladium chloride, similar reducing conditions such as those just described effect only a small change.

3. Methyl Amine Borane

This compound is another reducing agent which has been used in electroless deposition of copper and nickel from solution. However no reduction of black cupric oxide treated surfaces took place at concentrations of methyl amine borane up to 35 g/l.; temperatures up to 200° F., and concentrations of 20 g/l. NaOH.

4. Hydrazine

Hydrazine produces some greenish hydrous cuprous oxide. When this is treated with HCl-NaCl, the greenish hydrous cuprous oxide is dissolved, but the surface is powdery, does not have an adequate copper whisker structure, and the peel strength is low, e.g. about 2–3 lbs/in.

5. Sodium Hydrosulfite

Sodium hydrosulfite ($Na_2S_2O_4$) is a known reducing agent which has not been used (as have the above reducing agents) for electroless metal deposition procedures. It has been used commercially for reducing dyes in textile processing for example.

Sodium hydrosulfite reacts rapidly in sodium hydroxide solution with black cupric oxide treated surfaces to produce a powdery copper product similar to that described in Example 1. However, when a small amount of gelatin or the like is added to the solution, an unexpected result is obtained. At first, the surface of the black oxide turns greenish and only later does the surface change to powdery copper. The greenish material comprises a hydrous cuprous oxide. If the reduction process is interrupted while the surface is still green, the cuprous hydroxide can be selectively dissolved with a reagent which does not react with metallic copper.

One such selective reagent is dilute hydrochloric acid, preferably containing high concentration of chloride ion. Sodium chloride or the like provides such chloride. The HCl-NaCl reagent dissolves the greenish hydrous cuprous oxide at room temperatures in 20 seconds or so, leaving behind a non-powdery "copper whisker" surface. Thus, simultaneous with the reduction to green cuprous hydroxide, a portion of the original black cupric oxide whiskers is reduced in one stage to metallic copper whiskers. This reduction is performed at a temperature ranging from about 35° to 50° C., preferably from about 38 to about 42° C.

If the reduction procedure is allowed to continue, the first produced greenish hydrous cuprous oxide is further reduced in a secondary reaction to powdery copper. This copper powder cannot be separated from the copper whisker structure. Thus, it will be understood by practitioners in the art that the reduction must be interrupted before any significant secondary reduction of green cuprous hydroxide to powdery copper, but not before the black oxide has been sufficiently reduced to metallic copper.

In an example, a solution containing 20 g/l. NaOH, 25 g/l. $Na_2S_2O_4$ and 125 g/l. gelatin is prepared. A sheet of copper foil laminate, which has been etched to circuit lines and treated to produce a black cupric oxide surface, is immersed in the solution at 40° C. in about 30 seconds, the black surface changes color to a greenish yellow. The foil is removed after a total of 150 seconds and rinsed thoroughly in water. It is then dipped into an HCl-NaCl reagent (which in this example solution of 0.1N HCl plus 100 g/l. NaCl) for about 20 seconds. The surface color changes from green to reddish brown.

The sample is then washed, preferably with water, and is then rinsed with or dipped into a passivating chromate solution known to the art (0.5 g/l. $CrO_3$+0.5 g/l. $Na_2CrO_4$ in this example), again washed and/or rinsed and then dried.

The passivating chromate solution is an oxidation inhibitor, which provides a protective layer that prevents further (post-treatment) oxidation of the copper surface layer. Water, as used in the washing step, is used to remove any excess solvents, solutions or other unwanted materials which may be present. Other solutions may be used to wash, rinse, or otherwise treat the copper surface, and these treatments are within the scope of the invention.

The resulting surface is not powdery. No powder transfer is found either by wiping with a soft paper tissue or by application and removal of adhesive tape. The sample has a peel strength of 5.9 lbs./in. after laminating to an epoxy substrate. It showed excellent blister resistance to molten solder. After drilling holes and immersion in 10% hydrochloric acid for an hour, there was no sign of pink ring. Prolonged exposure to conditions of high humidity produced no delamination nor any signs of degradation. Similarly, alternate high and low temperature cycling produced no change.

6. Combined Treatment

As a special procedure, in order to produce multilayer laminates with more equal adhesion on the two sides of the copper, the original copper foil has an electro-deposited Treatment A applied to the shiny side rather than to the matte side. The so treated shiny side is laminated to the resinous substrate and after photo resist, etching and photo resist removal steps, the exposed matte side circuit lines are black oxide treated and the black oxide reduced in accordance with the present invention. The peel strength of black oxide-reduced treatment on matte surfaces is from 8–10 lb/in., very similar to the peel strength of Treatment A-treated shiny side cooper foil.

Without being bound by any particular theory, an explanation underlying the invention appears to be as follows:

Cupric oxide in whisker form may be reduced, either to the cuprous level, as in the form of cuprous hydroxide or hydrous cuprous oxide on the one hand; or, cupric oxide may be reduced directly to metallic copper. Cuprous hydroxide, once formed, may be secondarily reduced, that is in a second stage, to metallic copper. In order to produce metallic copper whiskers, the black cupric oxide whiskers must be reduced to metallic copper directly in one stage in such a manner that the whisker filament, although it may be shrunk in volume, maintains its physical structure, rather than breaking up into bits of cupric oxide or metallic copper segments. Cuprous hydroxide does not have a discrete whisker structure. Rather, it is in the form of a hydrous oxide mass. If this cuprous hydrous mass is reduced secondarily, the metallic copper product is in the form of fine particles or powder. Similarly, separated segments of cupric oxide broken off from whiskers can be secondarily reduced only to copper powder.

The present invention uses a special reduction process in the presence of an appropriate addition agent. In a time period depending on temperature and concentrations of the reagents, a mixture of discrete copper whiskers is produced simultaneously with a mass of hydrous cuprous oxide. The hydrous cuprous oxide is separated from the copper whiskers with a selective reagent which dissolves the hydrous cuprous oxide without substantially attacking the copper whiskers.

The reducing agent according to the invention is a rate-sensitive reductant having a reduction potential and kinetic properties such that solid cupric oxide (e.g., in the form of microdendrites or "whiskers") is reduced in one step to solid copper. By rate-sensitive is meant that the reductant acts upon the surface of at least a portion of the original population of cupric oxide whiskers in a manner which prevents rapid and undesirable break-up of the whiskered structure. This is done despite the loss of mass and volume related to the stoichiometry of the chemical reaction and the resulting density of the final product. Thus, the invention preserves the highly advantageous whiskered structure and the superior bonding properties which that structure achieves, while avoiding the problems associated with an oxide surface by providing a superior metallic copper surface.

In the compositions and methods of the present embodiments of the invention, the reducing agent (e.g., sodium hydrosulfite) is used in an amount ranging from about 5 to about 100 g/l, preferably about 20 to about 30 g/l.

The addition agents which have been found useful in the invention include polymeric substances such as gelatin, glue, gum arabic, dextrin, polyacrylic acid and the like. These addition agents have been found in the past to be useful in modifying the grain size of copper deposits in electrodeposition. On the other hand, thiourea, a low molecular weight compound, very active as an addition agent known to the art in electrodeposition, is not useful or effective in the practice of my invention. The addition agent is used in an amount ranging from about 50 to about 250 mg/l, preferably about 100 to about 150 g/l.

When sodium hydroxide is used as an alkaline solution, it is present in an amount ranging from about 5 to about 200 g/l, preferably about 15 to about 130 g/l.

The HCl-NaCl reagent of the invention can typically contain from about 0.05N, to about 2N HCl, preferably about 0.1N to about 0.5N, and from about 50 g/l NaCl to saturation, preferably about 100 to about 200 g/l. This reagent, or its equivalent is typically used at or slightly above room temperature, for from 10 to 60 seconds, preferably 10 to 20 seconds.

A treated copper surface prepared according to the invention may be used as a substrate for the deposition of other metals, such as copper, nickel, tin, tin-lead and the like. This can be achieved by methods such as cementation and "electroless" deposition procedures. Cementation can not be used with a conventional black oxide surface, but can be used with the metallic copper surface of the invention. Electroless deposition requires the use of reducing agents, such as formaldehyde or sodium hypophosphite, in reaction with solutions of chelated metal ions (such as ions of copper, nickel, or tin to be deposited). Such procedures reduce the copper oxide whiskers of the black oxide treatment to undesirable powdery copper, which in turn interferes with bonding of the electroless deposited metal to the substrate.

These problems are overcome by the present invention, which provides a metallic copper surface, rather than an oxide surface that is reduced by the reducing agent in the deposition plating solution. As a result, superimposed deposited metallic layers are firmly bonded to the copper substrate. This is particularly advantageous in through-hole plating, for interconnection between copper surfaces on either side of a resinous laminate. The invention provides superior bonding at the through hole, not only of the copper surface to the laminate, but also at the junction between the copper surface of the circuit board and the metallic surface coating the through-hole.

I claim:

1. A method of treating an oxidized copper surface comprising:
   reducing said oxidized copper surface in alkaline solution with a reducing agent if the presence of a polymer addition agent,
   exposing said reduced surface to a nonoxidizing reagent which dissolves hydrous cuprous oxide and does not substantially dissolve metallic copper, and
   rinsing said surface at least once and thereafter drying said surface.

2. A method according to claim 1, wherein said reducing agent is sodium hydrosulfite and said alkaline solution is a sodium hydroxide solution.

3. A method according to claim 1, wherein said polymer addition agent is a high molecular weight material selected from the group consisting of glue, gelatin, gum arabica, dextrin, and polyacrylate.

4. A method according to claim 1, wherein said nonoxidizing reagent comprises a source of chloride ions in acid solution.

5. A method according to claim 1, wherein said reducing, step is performed at a temperature ranging from 35° to 50° C.

6. A method according to claim 1, wherein said nonoxidizing reagent is selected from the group consisting of dilute hydrochloric acid and a mixture of dilute hydrochloric acid and sodium chloride.

7. A method according to claim 1, wherein the reducing agent is from 5 to 100 g/l of sodium hydrosulfite, the alkaline solution contains from 5 to 200 g/l of sodium hydroxide, the addition agent is from 50 to 250 g/l of gelatin, and the nonoxidizing reagent is 100 g/l of sodium chloride in 0.1 normal hydrochloric acid.

8. A method according to claim 7, wherein said reducing step is performed for about 2 to 3 minutes at a temperature of 38° to 42° C., using 25 g/l of sodium hydrosulfite, 20 g/l of sodium hydroxide, and 125 g/l of gelatin, and said exposing step is performed for about 10 to 30 seconds.

9. A method according to claim 1 wherein said reduced surface is washed prior to said exposing step.

10. A method according to claim 1, wherein said rinsing step is performed at least twice, using a passivating chromate solution at least once.

11. A method according to claim 10, wherein said passivating chromate solution is a mixture of about 0.5 g/l. $CrO_3$ and about 0.5 g/l. $Na_2CrO_4$.

12. A method according to claim 8, wherein said reduced surface is washed with water prior to said exposing step, and wherein said rinsing step is performed at least twice, using a passivating chromate solution at least once, said chromate solution comprising a mixture of about 0.5 g/l. $CrO_3$ and about 0.5 g/l. $Na_2CrO_4$.

13. A method of treating an oxidized copper surface comprising:
   reducing said oxidized copper surface with sodium hydrosulfite in the presence of sodium hydroxide and a polymer addition agent selected from the group consisting of glue, gelatin, gum arabica, dextrin, and polyacrylate,
   washing said reduced surface,
   exposing said reduced surface to a nonoxidizing reagent selected from the group consisting of dilute hydrochloric acid and a mixture of dilute hydrochloric acid and sodium chloride, and;
   rinsing said surface at least twice, using a passivating chromate solution at least once, said chromate solution comprising a mixture of about 0.5 g/l. $CrO3$ and about 0.5 g/l. $Na_2CrO_4$, and
   drying said surface.

14. A method of treating an oxidized copper surface comprising:
   reducing said oxidized copper surface in alkaline solution with a reducing agent in the presence of a polymer addition agent,
   exposing said reduced surface to a nonoxidizing reagent which dissolves hydrous cuprous oxide and does not substantially dissolve metallic copper,
   rinsing said surface at least once and thereafter drying said surface,
   and depositing a superimposed metallic layer over at least a portion of said surface.

15. A method according to claim 14, wherein said metal is selected from the group consisting of copper, nickel, lead, and tin.

16. A method according to claim 14, wherein said surface is bonded to a resinous laminate, and said surface and laminate are provided with a plurality of through-holes joining said surface to a second surface, and wherein said superimposed metallic layer is deposited over at least the portion of said surface proximate to and in contact with said through-holes.

* * * * *